(12) United States Patent
Li

(10) Patent No.: US 12,401,738 B2
(45) Date of Patent: Aug. 26, 2025

(54) Wi-Fi HOTSPOT TRANSLATION MOBILE PHONE

(71) Applicant: Szu Cheng Ma, Taoyuan (TW)

(72) Inventor: Huan Pien Li, Taoyuan (TW)

(73) Assignee: Szu Cheng Ma, Taoyuan (TW)

( * ) Notice: Subject to any disclaimer, the term of this patent is extended or adjusted under 35 U.S.C. 154(b) by 385 days.

(21) Appl. No.: 18/172,644

(22) Filed: Feb. 22, 2023

(65) Prior Publication Data

US 2024/0283860 A1   Aug. 22, 2024

(51) Int. Cl.
*H05K 7/20* (2006.01)
*H04M 1/215* (2006.01)

(52) U.S. Cl.
CPC ........ *H04M 1/215* (2013.01); *H05K 7/20136* (2013.01); *H05K 7/20327* (2013.01); *H05K 7/2039* (2013.01)

(58) Field of Classification Search
CPC ............ H04M 1/215; H04M 1/72412; H04M 1/0258; H04M 1/724095; H04M 2250/06; H04M 2250/58; H04M 1/185; H05K 7/20136; H05K 7/20327; H05K 7/2039; H05K 5/0211; H05K 7/20172; H05K 7/20436; G06F 1/163; G06F 1/1698; G06F 2200/1633; G06F 1/1626; G06F 1/1632; G06F 1/203; G06F 1/206
USPC ....................................... 455/556.1
See application file for complete search history.

(56) References Cited

U.S. PATENT DOCUMENTS

2012/0236733 A1 * 9/2012 Deu-Ngoc ............ H04L 67/535
370/252

FOREIGN PATENT DOCUMENTS

| CN | 113885973 B | * | 7/2024 | ............. G06F 40/58 |
| GB | 2428153 A | * | 1/2007 | ............. B60K 37/00 |
| WO | WO-2013049248 A2 | * | 4/2013 | ......... G02B 27/0093 |
| WO | WO-2020125839 A1 | * | 6/2020 | ............. G06F 21/31 |

* cited by examiner

*Primary Examiner* — Tanmay K Shah
(74) *Attorney, Agent, or Firm* — Birch, Stewart, Kolasch & Birch, LLP

(57) ABSTRACT

The invention relates to a Wi-Fi hotspot translation mobile phone, having a Wi-Fi hotspot and translation device, using the oscillating heat dissipation module to improve the heat dissipation performance, and then using the phase change temperature regulating micro airbag to achieve the effect of intelligent temperature adjustment, integrating the traditional Wi-Fi hotspot machine and translation machine, and becoming a compound machine of Wi-Fi hotspot and translation device, it is combined with the smart phone, using the artificial intelligence chip, parallel computing and processing, so that the working efficiency of the Wi-Fi hotspot and translation device is greatly improved, and then has the function of integrating the functions of Wi-Fi hotspot machine, translator machine and smart phone into a Wi-Fi hotspot translation mobile phone that is easy to carry abroad.

8 Claims, 16 Drawing Sheets

100A

Wi-Fi HOTSPOT TRANSLATION MOBILE PHONE

BACKGROUND OF THE INVENTION

1. Field of the Invention

The invention relates to a Wi-Fi hotspot translation mobile phone, especially to one that combines a smart phone with a Wi-Fi hotspot and translation device, to achieve parallel computing.

2. Description of the Related Art

Mobile devices such as smart phones and tablet computers have become a necessary part of our lives, so almost everyone own a smart phone, and because a smart phone is equipped with: processing unit (CPU), display screen, camera, speaker unit, microphone unit, memory; wireless transmission unit, media operation interface, etc., so smart phones have also changed the usage habits of our daily life. For example, smart phones have replaced ordinary cameras, translator machines, and game consoles, etc. However, current smartphones generally lack a graphics processing unit (GPU) and artificial intelligence chips, so it is a pity that they cannot improve the performance of cameras, translator machines, game consoles, etc.

When traveling abroad, following the map to visit scenic spots, checking food reviews of restaurant, communicating with locals, etc. "Abroad Internet" is definitely an indispensable part when you are in a different place! It is impossible to use international roaming all the time when using a mobile phone abroad, because there are sky-high transmission fees. Therefore, as shown in FIG. 1A, renting a Wi-Fi sharing machine 91 at the airport when going abroad to provide the wireless communication required by the smart phone 90 is better than directly buying a SIM card or an international roaming card, and it should be more convenient and saves more money.

When traveling abroad, shopping, or general business negotiations, it is often difficult to communicate with people of different nationalities due to language differences. Therefore, in communication situations, many people will use a commercially available translator machine to translate their words into a text that the other party understands, and then read the text out; however, this method has its shortcomings in its use: First of all, since the keys are pre-set and the area is limited, it is impossible to set all the characters on the keys, so that the input characters are limited to specific characters, such as English, Chinese or Japanese, etc., causing the text to be translated to be limited and cannot be used in multiple languages. In addition, commercially available translator machines 92 mostly have only a single display screen as shown in FIG. 1B, the use types the text to be translated (for example: English), or voice input, after pressing the translation key, it will be translated into another language (for example: Chinese) well-known to the other party on the same display screen. Then, show the display screen to the other party, so that the display screen is constantly moved back and forth, causing inconvenience in communication.

The purpose of the present invention is to solve the above mentioned problems.

SUMMARY OF THE INVENTION

It is a primary objective of the present invention to provide a Wi-Fi hotspot translation mobile phone, which can parallel compute with smart phones to improve processing speed and efficiency, and integrate the functions of Wi-Fi hotspot machine, translation machine and smart phones into a Wi-Fi hotspot translation mobile phone for abroad travel, and has many convenient functions used at the same time.

In order to achieve the above objectives, the present invention including: a smart phone having a front side, a rear side, and a body periphery located between the front side and the rear side, and inside the smart phone having a first processing unit, a first display unit, a camera, a first speaker unit, a first microphone unit, a memory, a first wireless transmission unit, a first interface, a first battery, and a first charging port; a Wi-Fi hotspot and translation device including a casing, the casing has an inner edge surface, an outer edge surface, and a peripheral edge between the inner edge surface and the outer edge surface, a control circuit board, and a plurality of electronic components or heating components provided on the control circuit board, and a second battery; wherein the Wi-Fi hotspot and translation device can be combined with the smart phone, the casing including: a first nano crystal heat dissipation coating, which consists of: a mixture of nano natural crystal powder, quartz powder, graphite powder, silicon oxide, and UV photosensitive hardener, and coated on the inner surface of the casing; a first thin oscillating plate, which is a passive element composed of a tiny ultrasonic oscillator, a quartz oscillator, and a piezoelectric ceramic plate, since the second battery supplies power to it, it can generate a micro-vibration above 30 MHZ when energized, it is installed in the casing and close to the first nano crystal heat dissipation coating to form a first oscillation heat dissipation module, which uses the ion wind or ultrasonic waves released by the first thin oscillating plate to generate resonance to improve the air convection effect of the first nano crystal heat dissipation coating, so as to improve the heat dissipation efficiency of the oscillating heat dissipation module; a phase change temperature regulating micro airbag, with a phase change material as a core, a polymer material as a core shell, and the phase change material is covered inside the micron and/or nanoparticle, forming a phase change temperature regulating micro airbag with a core shell structure, and injection molding the phase change temperature regulating micro airbag on the CPU, GPU, or high-power chip of the circuit board, or filling it in the casing, using the change of the solid-liquid phase state of phase change material, so that the phase change material absorbs or releases a large amount of latent heat, so as to keep the temperature of the micro airbag constant; a heat dissipation plate is arranged in the casing and relative to the position of the circuit board, its surface is coated with a second nano crystal heat dissipation coating, and the inner surface is provided with a second thin oscillating plate relative to the position of the phase change temperature regulation micro airbag to form a second oscillating heat dissipation module; a thin fan is arranged in the casing, and the casing is provided with an air inlet and an air outlet relative to the position of the thin fan; and on the circuit board including: a). a second processing unit; b). a second display unit is electrically connected to the second processing unit, and exposed at the outer periphery of the casing; c). a Wi-Fi module is electrically connected to the second processing unit, for receiving wireless communication signal in the local country; d). a second speaker unit is electrically connected to the second processing unit, and exposed at the outer periphery of the casing; e). a second microphone unit is electrically connected to the second processing unit, and exposed at the outer periphery of the casing; f). a second wireless transmission unit is electrically connected to the second processing unit, the Wi-Fi hotspot and translation device forms a mutual correspondence wireless transmission mode with the first wireless transmission unit of the smart phone through the second wireless transmission unit; g). a second interface is electrically connected to the second processing unit, and exposed at the outer periphery of the casing for providing user to operate; h). an artificial intelligence chip is electrically connected to the second processing unit, and has an AI program built in it; i). a mobile payment module is electrically connected to the second processing unit; and the second battery is arranged in the casing and is electrically connected to the second processing unit to supply power required by the electronic components in the casing; a second charging port is electrically connected to the second battery, and connects the external power supply with a second charging wire; whereby combining the Wi-Fi hotspot and translation device and the smart phone allow the smart phone to receive wireless communication signal, make the smart phone connect with a translation software on the cloud through the first wireless transmission unit, and then through the first wireless transmission unit and the second wireless transmission unit of the Wi-Fi hotspot and translation device, the wireless transmission is synchronized with each other, so as to form a type of a dual display translation mobile phone that can be used separately.

Also, the periphery of the frame of the Wi-Fi hotspot and translation device can be set to be compatible with the body periphery of the smart phone, and a buckle unit is provided on both sides of the frame to allow the smart phone to be installed in the Wi-Fi hotspot and translation device, so as to form a back clip type dual display translation smart phone.

Also, the Wi-Fi hotspot and translation device can be arranged on a foldable body, the foldable body includes a base, a cover and a pivoting part, wherein the base is used to accommodate the Wi-Fi hotspot and translation device, the cover is used to accommodate the smart phone, by the characteristic of the pivoting part being in a folded state or an unfolded state, so as to form foldable type dual display translation smart phone.

Also, the Wi-Fi hotspot and translation device and the smart phone can be set on a watch body, the watch body includes a watch strap, and a seat body set on the watch strap, and the smart phone is in the form of a smaller body and set in the seat body, and the seat body is provided with a combination groove on the top of the smart phone; the Wi-Fi hotspot and translation device is set to be installed in the combination groove in normal state, and is combined with the seat body into one body, which can be separated from the combining groove when required, so as to form a watch type dual display translation smart phone.

With the features disclosed above, the present invention uses the original function of the smart phone to combine with the Wi-Fi hotspot and translation device, using the oscillating heat dissipation module to improve the heat dissipation performance, and then using the phase change temperature regulation micro airbag to achieve the effect of intelligent temperature adjustment, integrating the functions of the conventional Wi-Fi hotspot machine and translation machine into one, and becoming the structure of the Wi-Fi hotspot and translation device, and then combined with the smart phone, using the artificial intelligence chip, parallel computing processing, so that the working efficiency of the Wi-Fi hotspot and translation device is greatly improved, so that it can be used in parallel with the smart phone in various types, and then integrate the functions of the Wi-Fi hotspot and translation device and smart phone into a mobile phone for translation with Wi-Fi when going abroad, and at the same time has many convenient functions.

DETAILED DESCRIPTION OF THE PREFERRED EMBODIMENT

Figure 1A:
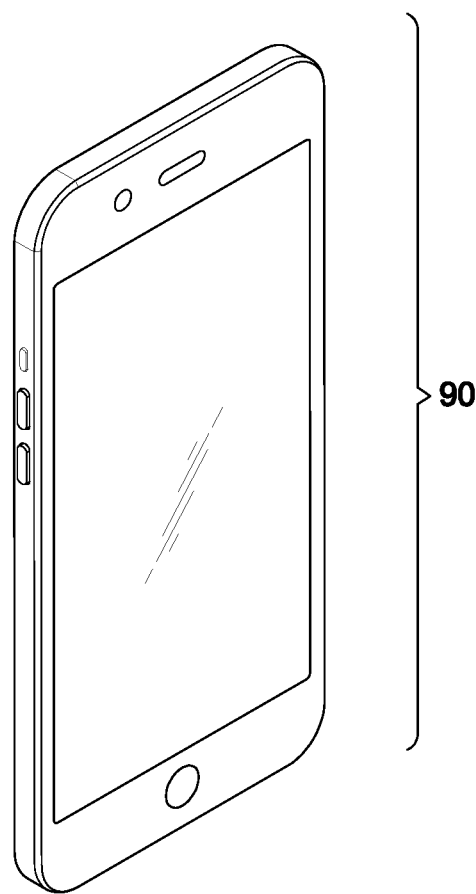
FIG. 1A is a schematic diagram illustrating the structure of the conventional Wi-Fi hotspot machine.
Figure 1A:
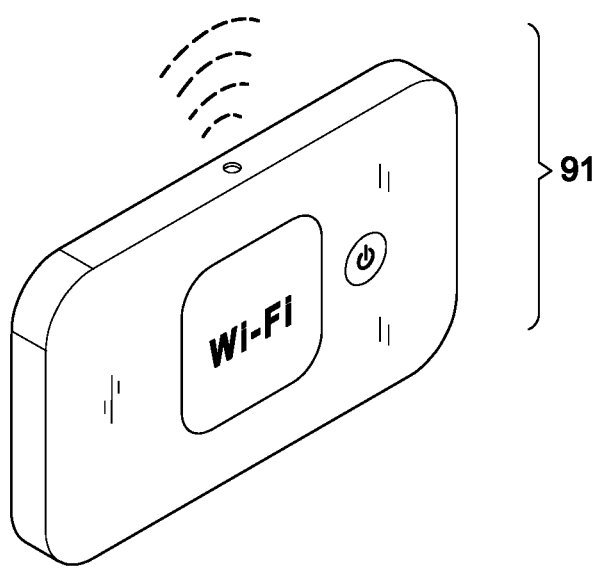
Figure 1B:
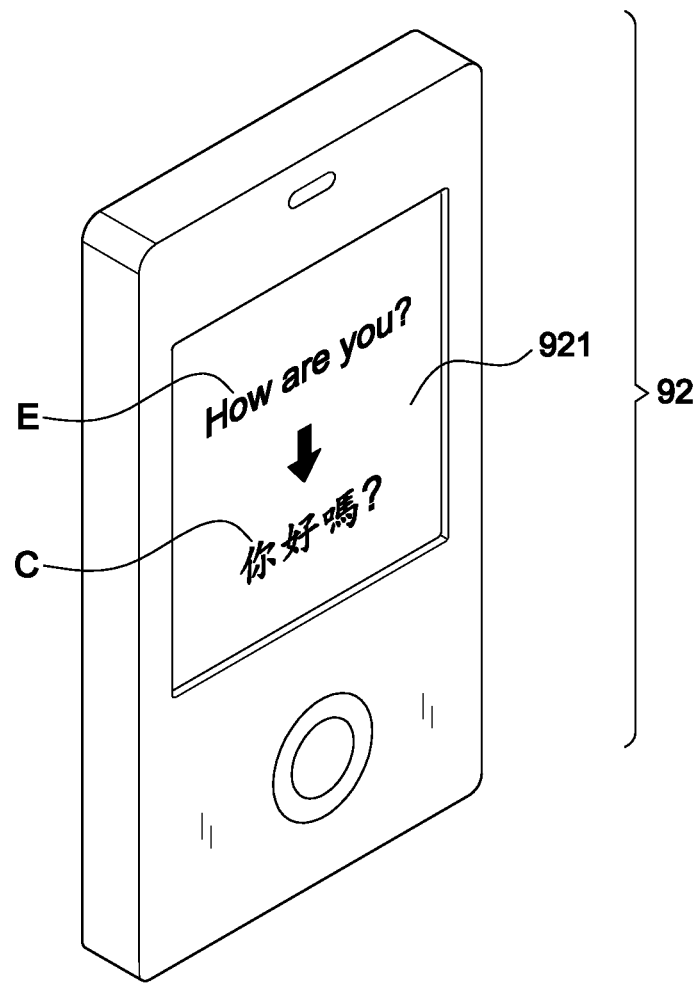
FIG. 1B is a perspective view of the structure of the conventional translation machine.

For better understanding of present invention, I provide the embodiment and drawing enclosed for detailed description. Those who skilled in the art can understand purpose, the feature and benefit of the present invention from the contents disclosed in this specification. Kindly noted that the present invention can be implemented or applied through other different specific embodiments and based on different viewpoints various details in this specification can be various changed without departing from the spirit of the present invention. In addition, the drawings attached to the present invention are merely a schematic illustration and they are not depicted in actual dimensions. The following embodiments will further describe the related technical content of the present invention in detail, but the disclosed content is not intended to limit the technical scope of the present invention.

Referring to FIGS. 2A~5, the present invention including: a smart phone 10, the phone body 100 has a front side 101, a rear side 102, and a body periphery 103 located between the front side 101 and the rear side 102, and inside the smart phone having a first processing unit 11, a first display unit 12, a camera 13, a first speaker unit 14, a first microphone unit 15, a memory 16, a first wireless transmission unit 17, a first interface 18, a first battery 19, and a first charging port 20; however, the above features are basic structure of the smart phone, which are belong to prior art, so I won't mention it in detail.

A Wi-Fi hotspot and translation device 30 including a casing 300, the casing 300 has an inner edge surface 301, an outer edge surface 302, and a peripheral edge 303 between the inner edge surface 301 and the outer edge surface 302, a control circuit board 40, and a plurality of electronic components 41 provided on the control circuit board, and a second battery 50.

The main feature of the present invention is: Wi-Fi hotspot and translation device 30 can be combined with the smart phone 10, the casing 300 including: a first nano crystal heat dissipation coating 61a, which consists of: a mixture of nano natural crystal powder, quartz powder, graphite powder, silicon oxide, and UV photosensitive hardener, and coated on the inner surface of the casing 300; a first thin oscillating plate 62a, which is a passive element composed of a tiny ultrasonic oscillator, a quartz oscillator, and a piezoelectric ceramic plate, since the second battery 50 supplies power to it, it can generate a micro-vibration above 30 MHZ when energized, it is installed in the casing 300 and close to the first nano crystal heat dissipation coating 61a to form a first oscillation heat dissipation module 60A, which uses the ion wind or ultrasonic waves released by the first thin oscillating plate 62a to generate resonance to improve the air convection effect of the first nano crystal heat dissipation coating 61a, so as to improve the heat dissipation efficiency of the oscillating heat dissipation module 60A.

A heat dissipation plate 43 is arranged in the casing 300 and relative to the position of the circuit board 40, its surface is coated with a second nano crystal heat dissipation coating 61b, and the inner surface is provided with a second thin oscillating plate 62b relative to the position of the phase change temperature regulation micro airbag 42 to form a second oscillating heat dissipation module 60B; a thin fan 60 is arranged in the casing 300, and the casing 300 is provided with an air inlet 305 and an air outlet 306 relative to the position of the thin fan 60. In this embodiment, the thin fan 60 is composed of membrane pump, and its purpose is to help the casing 300 dissipate heat.

Figure 2A:
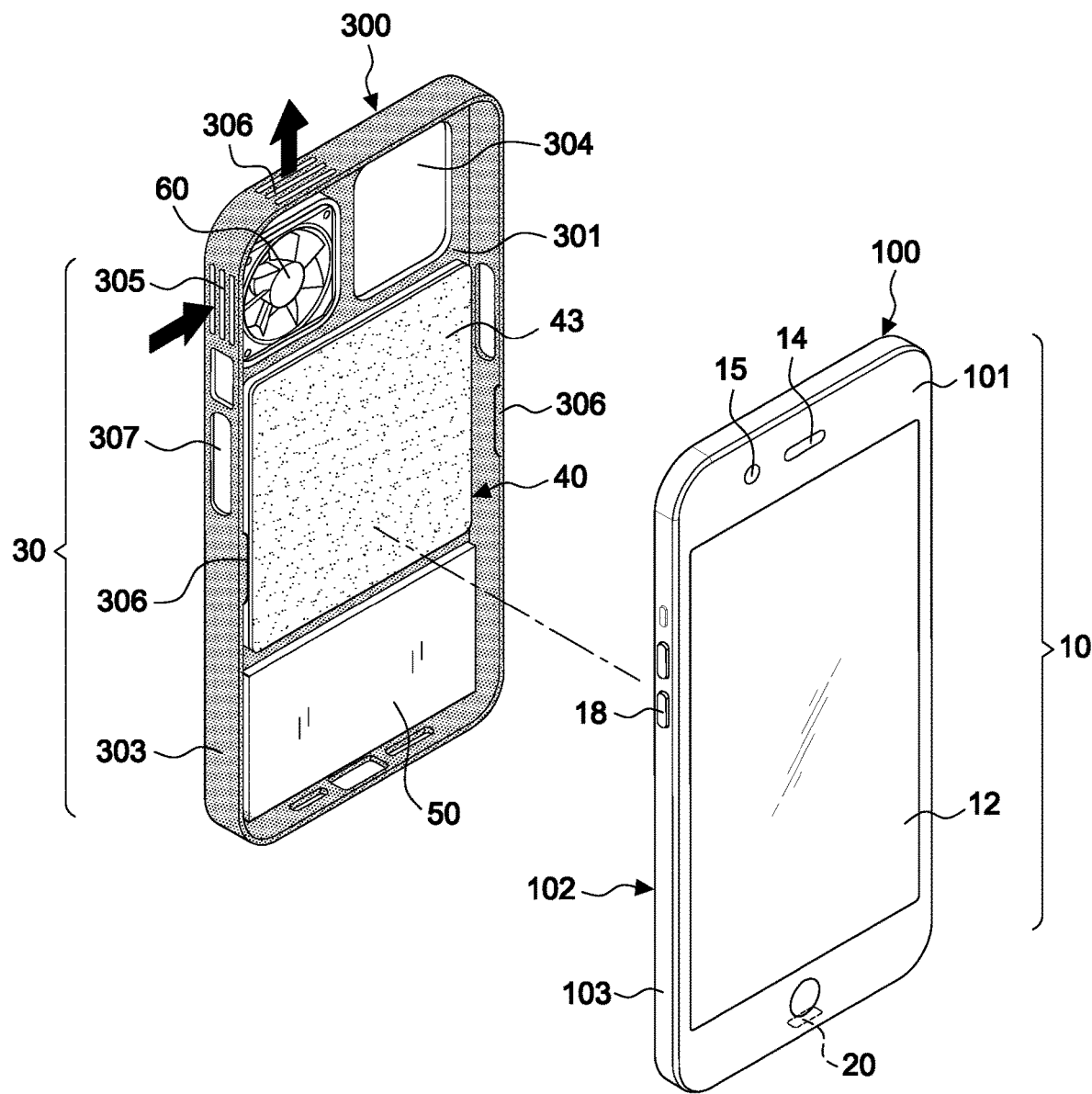
FIG. 2A is a front exploded perspective view of the structure of a first embodiment of the present invention.
Figure 2B:
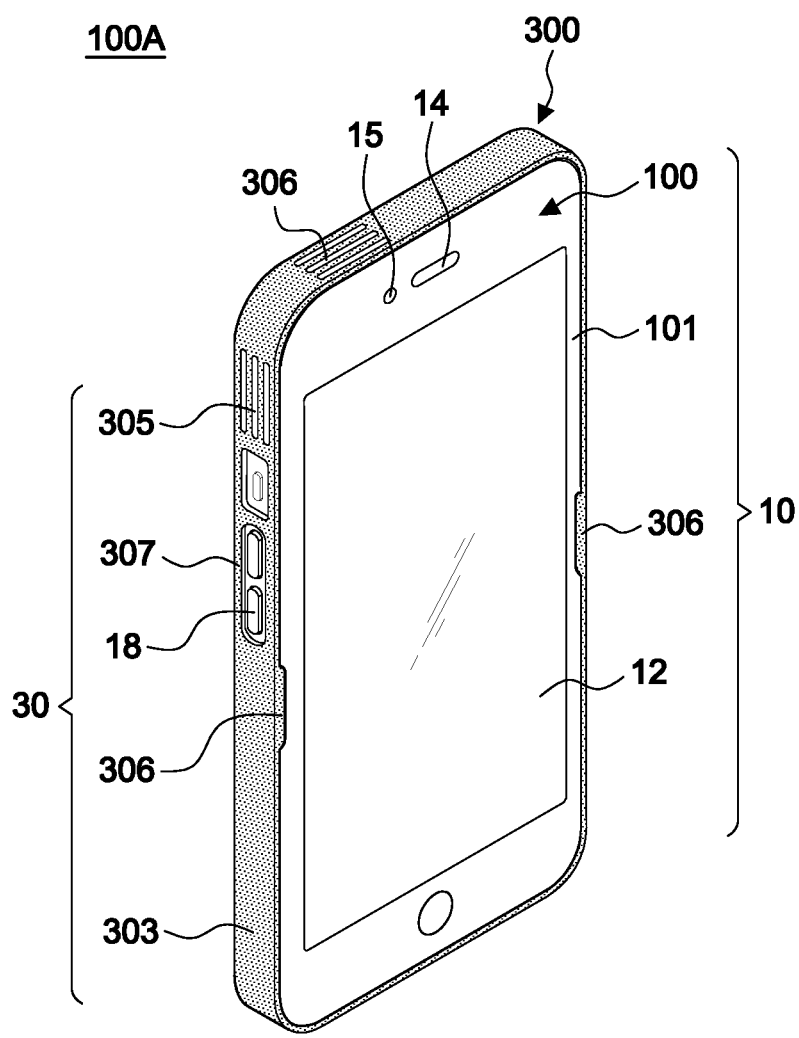
FIG. 2B is an assembly perspective view of FIG. 2A.
Figure 2C:
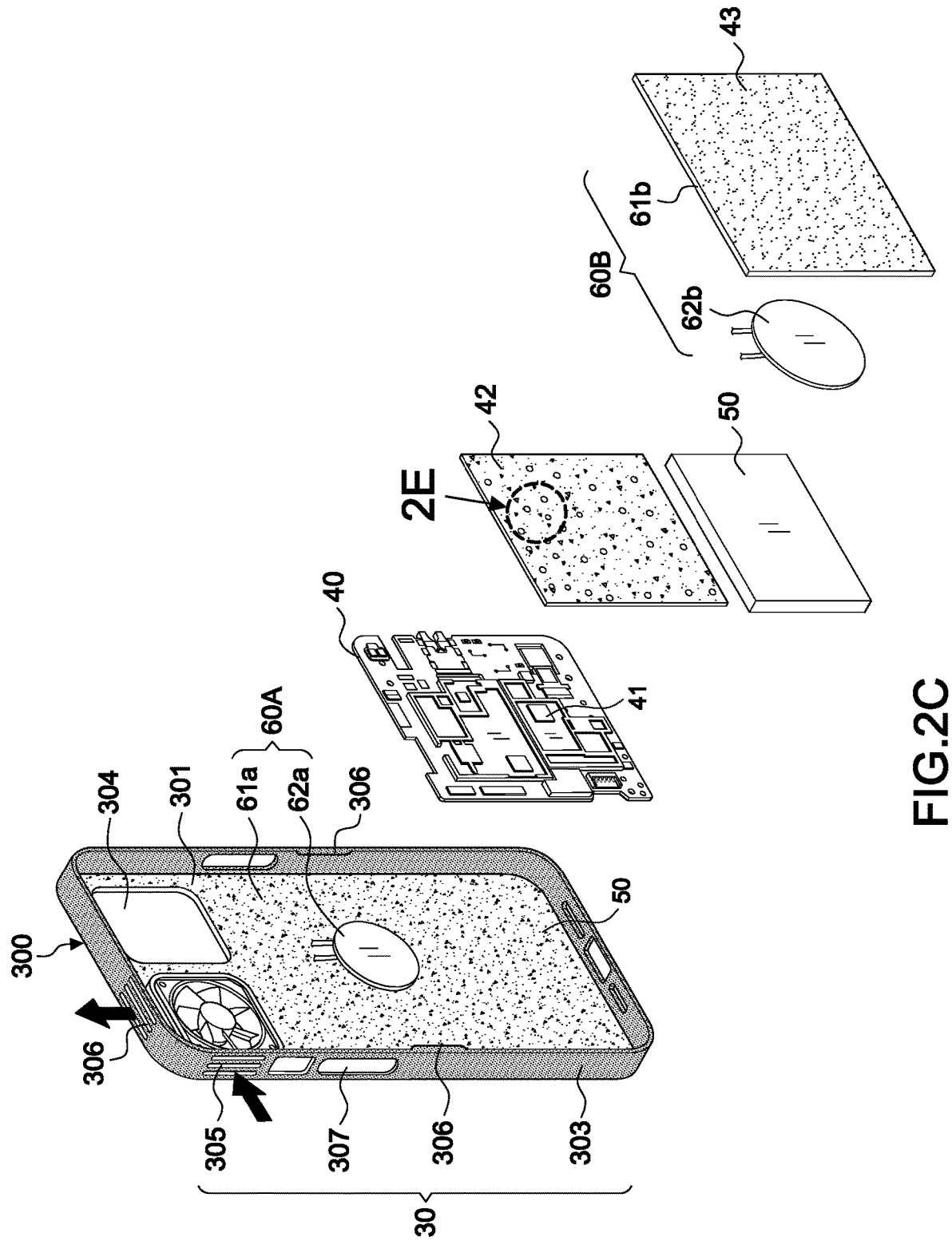
FIG. 2C is an exploded perspective view of the structure of a Wi-Fi hotspot and translation device of the present invention.
Figure 2D:
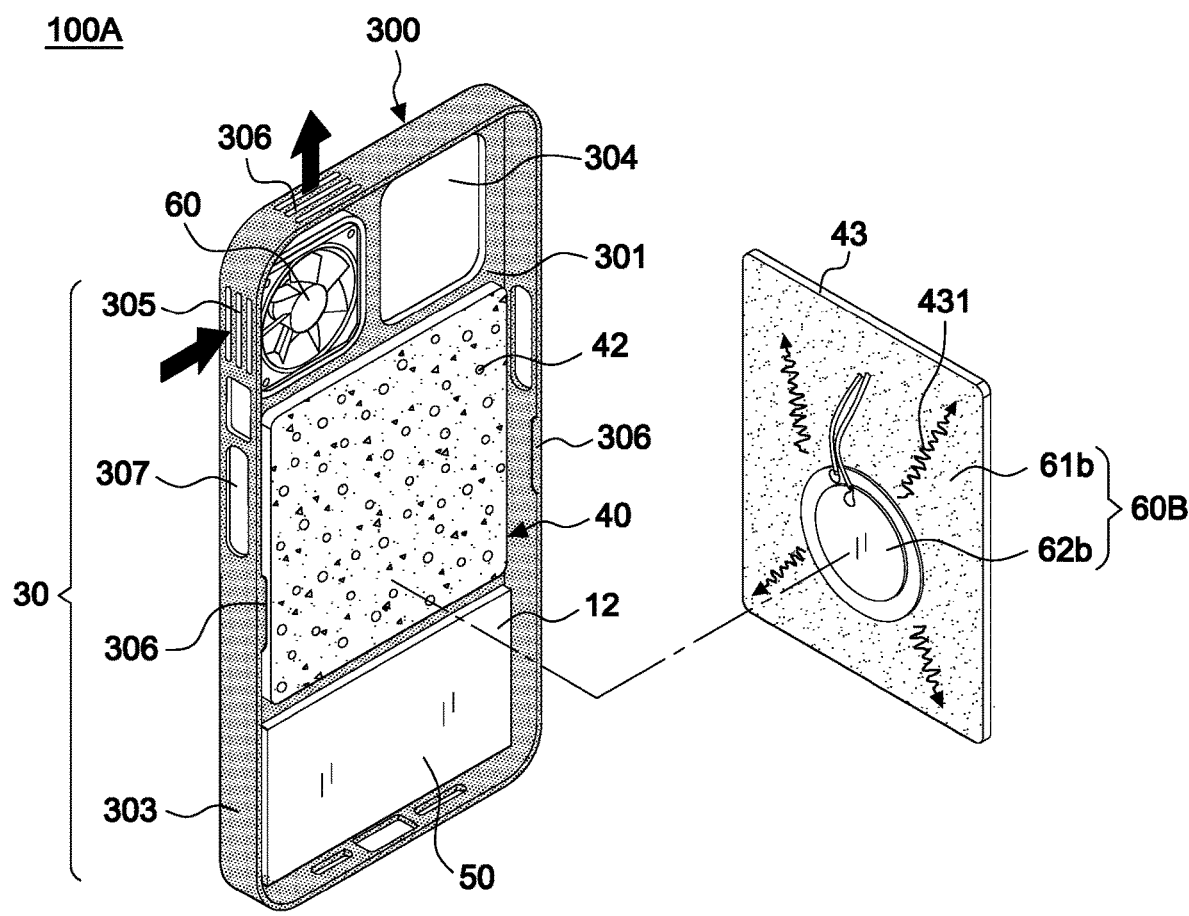
FIG. 2D is an exploded perspective view of a part of the Wi-Fi hotspot and translation device of the present invention.

Referring to FIG. 2D, the present invention uses the ion wind or ultrasonic waves released by the second thin oscillating plate 62b to generate resonance effect 431, improve the air convection effect of the second nano crystal heat dissipation coating 61b, thereby improving the heat dissipation efficiency of the second oscillating heat dissipation module 60B; So the second oscillating heat dissipation module 60B has a heat dissipation efficiency of combining the second nano crystal heat dissipation coating 61b and the second thin oscillating plate 62b.

Figure 2E:
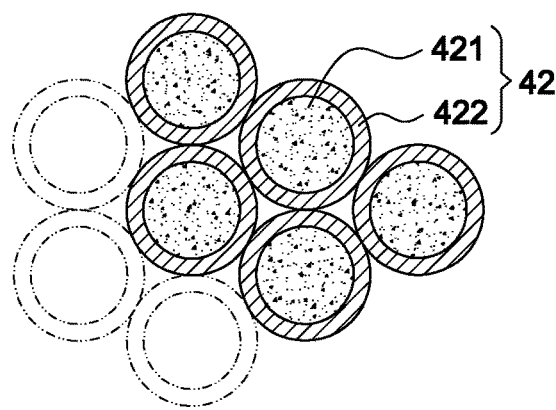
FIG. 2E is a zoom-in view of the part 2E in the FIG. 2C of the present invention.
Figure 2F:
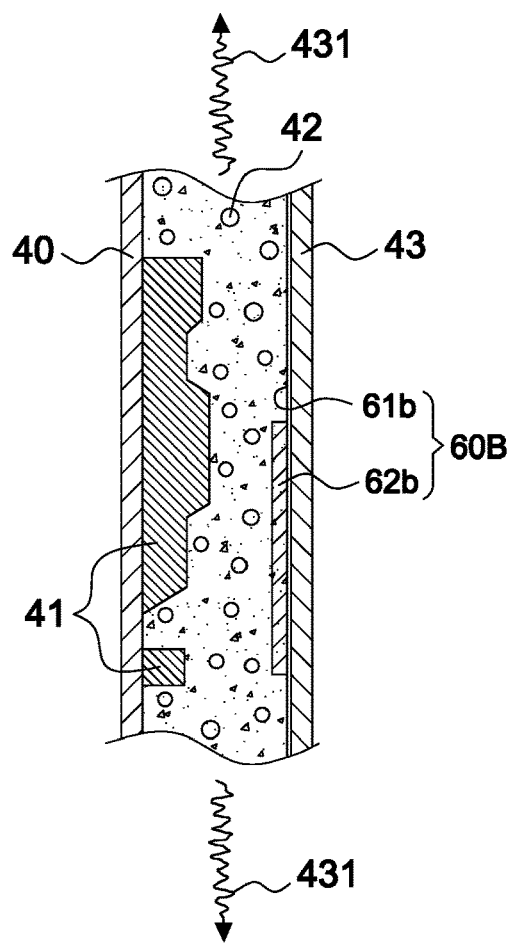
FIG. 2F is a sectional view of the structure of the oscillating heat dissipation module and the phase change temperature regulation micro airbag of the present invention.
Figure 3A:
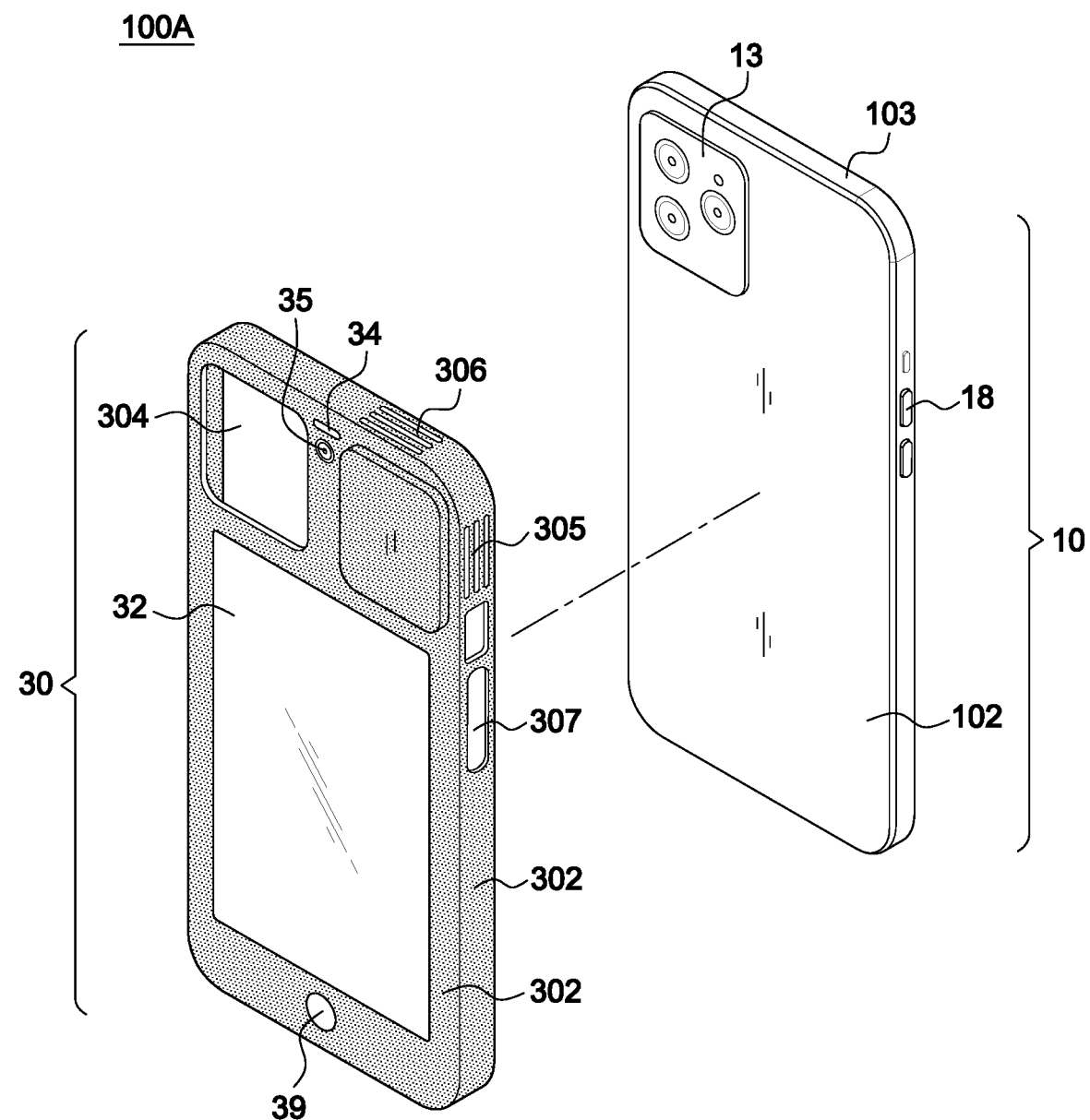
FIG. 3A is a rear exploded perspective view of the first embodiment of the present invention.
Figure 3B:
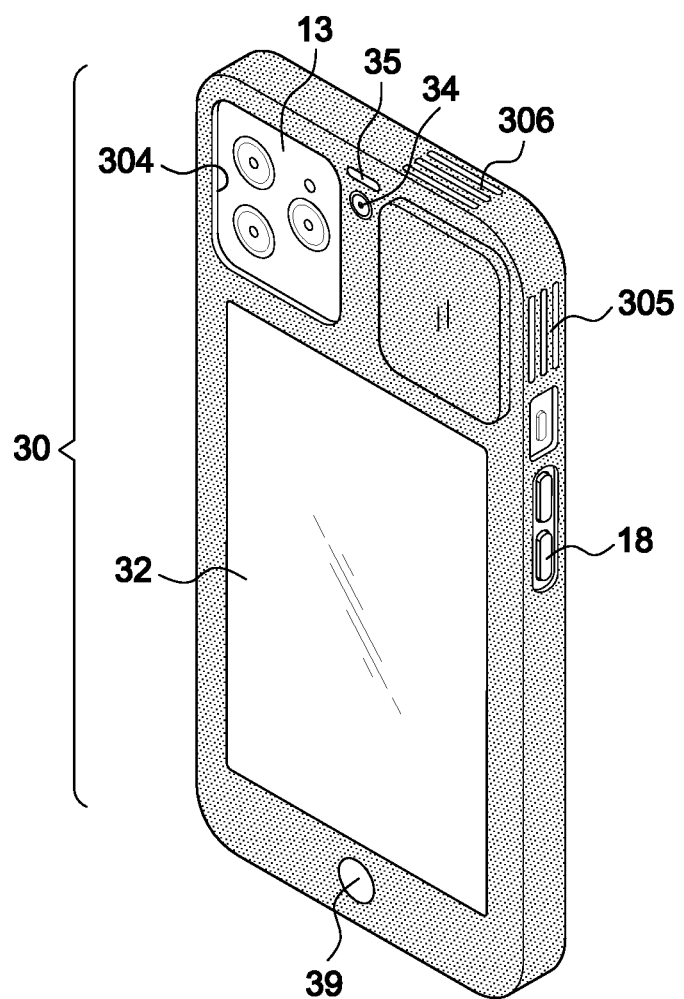
FIG. 3B is a rear assembly perspective view of the main structure of the of the present invention.

Referring to FIGS. 2C, 2E and 2F, a phase change temperature regulating micro airbag 42, with a phase change material 421 as a core, a polymer material as a core shell 422, and the phase change material 421 is covered inside the micron and/or nanoparticle, forming a phase change temperature regulating micro airbag 42 with a core shell structure, and injection molding the phase change temperature regulating micro airbag 42 on the electronic component 41 such as CPU, GPU, or high-power chip of the circuit board 40, or filling it in the casing 300, using the change of the solid-liquid phase state of phase change material 421, so that the phase change material 421 absorbs or releases a large amount of latent heat, so as to keep the temperature of the micro airbag constant.

In this embodiment, the phase change material 421 includes: paraffin wax, but not limited to this. The phase change temperature regulating micro airbag 42 has a particle size of 0.1~50 µm, an enthalpy of greater than 180° C., a heat resistance of greater than 200° C., and a phase change temperature of 0~70° C. As for the manufacturing method of the phase change material 421, it is a prior art and is not the subject of the patent of the present invention, so it will not be described in detail. The present invention uses the characteristics of the phase change temperature regulating micro airbag 42. As shown in FIG. 2F, the phase change temperature regulating micro airbag 42 is in the form of a solid sheet at room temperature, and softens when it reaches a specific temperature, by fluidity character after melting, it can completely fill the gaps of the electronic components 41 on the uneven surface of the circuit board 40, and utilize the phase change to adsorb the latent heat to achieve the effect of rapid cooling.

Moreover, the phase change material 421 of the phase change temperature regulating micro airbag 42 is covered by a core shell 422 containing a polymer material such as nano-quartz to avoid leakage and volatilization during the phase-change process, and to accelerate heat transfer. The phase change material 421 as the core is high thermal conductivity phase change microcapsules containing paraffin. The phase change temperature regulating micro airbag 42 with this improved structure can accelerate the release or absorption of heat by the phase-change material, so that it can effectively achieve the functions of heat conduction, heat dissipation, and energy storage.

Whereby the present invention uses the first and second oscillating heat dissipation modules 60A, 60B to improve the heat dissipation performance of the Wi-Fi hotspot and translation device 30, and then uses the phase change temperature regulating micro airbag 42, thereby achieving the effect of intelligently adjusting the temperature, so as to improve the practicality and reliability of the Wi-Fi hotspot and translation device 30.

Figure 4:
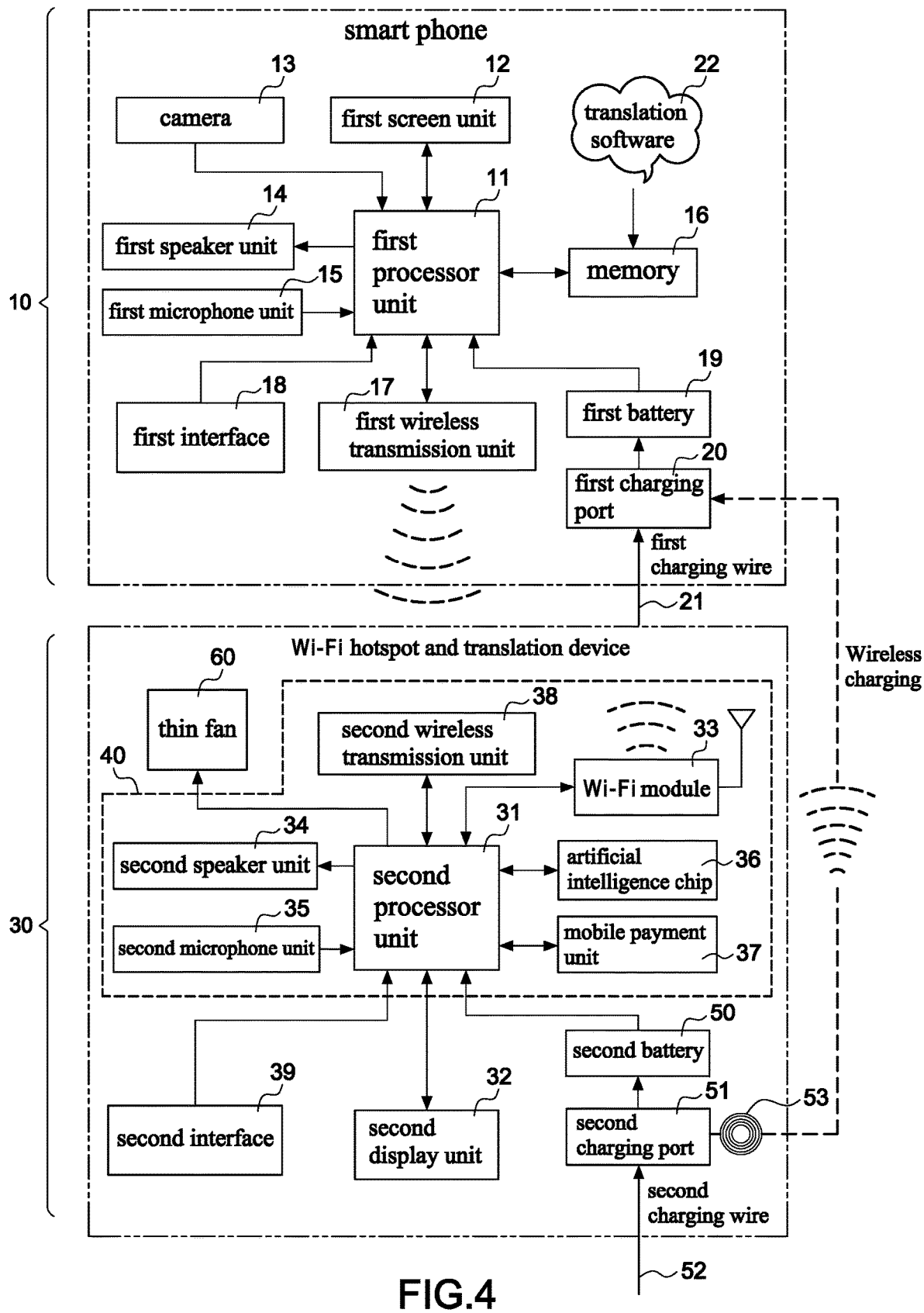
FIG. 4 is a block diagram showing the main structure of the of the present invention.

As shown in FIG. 4, in this embodiment, on the circuit board 40 including: a second processing unit 31; a second display unit 32 is electrically connected to the second processing unit 31, and exposed at the outer periphery of the casing 300; a Wi-Fi module 33 is electrically connected to the second processing unit 31, for receiving wireless communication signal in the local country; a second speaker unit 34 is electrically connected to the second processing unit 31, and exposed at an outer periphery 302 or a peripheral edge 303 of the casing 300; a second microphone unit 35 is electrically connected to the second processing unit 31, and exposed at the outer periphery 302 or the peripheral edge 303 of the casing 300; a second wireless transmission unit 38 is electrically connected to the second processing unit 31, the Wi-Fi hotspot and translation device 30 forms a mutual correspondence wireless transmission mode with the first wireless transmission unit 17 of the smart phone 10 through the second wireless transmission unit 38; a second interface 39 is electrically connected to the second processing unit 31, and exposed at the outer periphery 302 or the peripheral edge 303 of the casing 300 for providing user to operate; an artificial intelligence chip 36 is electrically connected to the second processing unit 31, and has an AI program built in it; in this embodiment, the first and second wireless transmission units 17, 38 include Wi-Fi system, Bluetooth system, etc., but are not limited these. A mobile payment module 37 is electrically connected to the second processing unit 31.

In this embodiment, the second battery 50 is arranged in the casing 300 and is electrically connected to the second processing unit 31 to supply power required by the electronic components in the casing 300; a second charging port 51 is electrically connected to the second battery 50, and connects the external power supply with a second charging wire 52; wherein the Wi-Fi hotspot and translation device 30 includes a wireless charging device 53 for providing wireless charging to the smart phone 10.

In first embodiment, the periphery of the frame of the Wi-Fi hotspot and translation device 30 is set to be compatible with the body periphery 103 of the smart phone 10, and a buckle unit 306 is provided on both sides of the frame to allow the smart phone 10 to be installed in the Wi-Fi hotspot and translation device 30.

Whereby combining the Wi-Fi hotspot and translation device 30 and the smart phone 10 allow the smart phone 10 to receive wireless communication signal, make the smart phone 10 connect with a translation software 22 on the cloud through the first wireless transmission unit 17, and then through the first wireless transmission unit 17 and the second wireless transmission unit 38 of the Wi-Fi hotspot and translation device 30, the wireless transmission is synchronized with each other, so as to form a back clip type dual display translation smart phone 100A.

Figure 5:
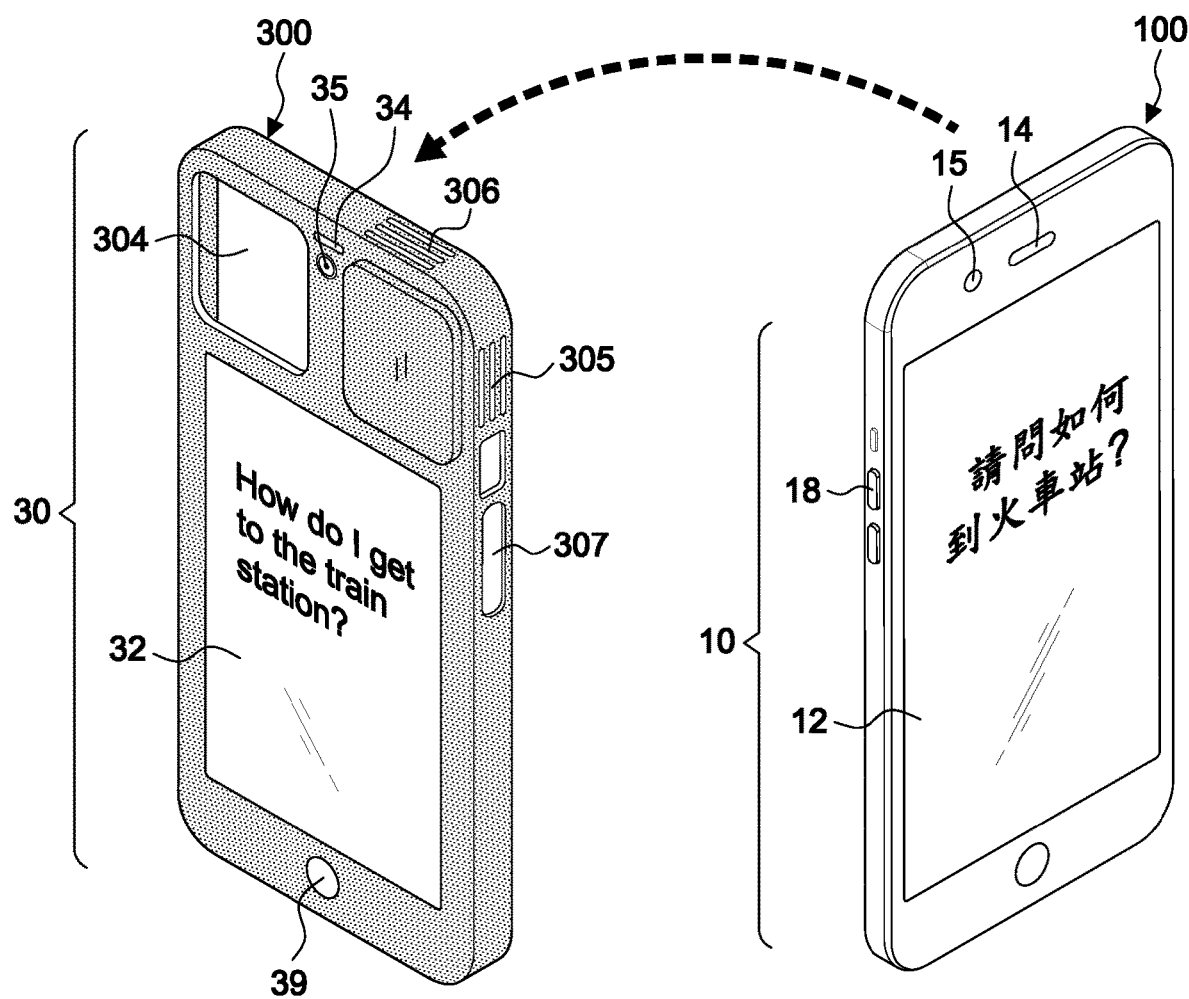
FIG. 5 is a schematic diagram illustrating the use state of the first embodiment of the present invention.

The main feature of back clip type dual display translation smart phone 100A, as shown in FIG. 5, the user directly and synchronously communicates with people through the second display unit 32 of the Wi-Fi hotspot and translation device 30, without the need to move back and forth like a conventional translation machine. Furthermore, the Wi-Fi hotspot and translation device 30 has a built-in artificial intelligence chip 36, which can intelligently learn and detect modes of more than 3 languages at the same time, because some people may carry English or Japanese words or phrases in their speech, in this way, it can be automatically detected, and it can be automatically switched without manual adjustment of the translation language mode. It can automatically detect the English accents of various countries, such as Indian and Singaporean accents, etc., which solves the problem that the current commercially available translators can only understand two different languages separately. The use state of the back clip type dual display translation smart phone 100A, it is easy to form a common language of the global village, and allow people to make friends from various countries on the real world and virtual network at any time, practice barrier-free communication, and the meaning of special words or puns can also be independently displayed on your own screen to understand the speaker and the other indirect hidden meanings in puns. The artificial intelligence chip 36 can learn deeply and apply it to various foreign language translations at any time, and there is no need to manually adjust all the time.

Also, the reason that Wi-Fi hotspot and translation device 30 of the present invention can be equipped with so many electronic components (for example: artificial intelligence chip 36) in a volume similar to that of the smart phone 10, and to enable it to fully exert its performance, it is mainly to use the first and second oscillating heat dissipation modules 60A, 60B to improve the heat dissipation performance of the Wi-Fi hotspot and translation device 30, and then use the phase change temperature regulation micro airbag 42, thereby achieving the effect of intelligently adjusting the temperature, so as to improve the practicability and reliability of the Wi-Fi hotspot and translation device 30. That is to say, without the first and second oscillating heat dissipation modules 60A, 60B and the phase change temperature regulation micro airbag 42, the Wi-Fi hotspot and translation device 30 cannot operate smoothly under such a volume. Therefore, the present invention integrates the functions of the traditional Wi-Fi hotspot machine and translation machine with the first and second oscillating heat dissipation modules 60A, 60B and the phase change temperature regulation micro airbag 42, and becomes the Wi-Fi hotspot and translation device 30, and then ingeniously combined with the smart phone 10, it can achieve the function of translating quality.

Therefore, the present invention is the first built-in Wi-Fi plus Ai automatic translation rental mobile phone. In addition to the aforementioned functions, it also has many derivative functions through the combination of high-efficiency electronic components, such as:

The built-in artificial intelligence translation output the translation result like actual human speaking. 2. It can automatically translate mother language to local language, and using it to watch as local APP programs such as YouTube, FB, Uber, etc. 3. The Wi-Fi hotspot translation mobile phone and the original smart phone are linked, one for user himself, one for guest, so as to communicate fluently. 4. Support local online mobile payment, such as traffic IC card. 5. Emergency rescue, call the police, and automatically contact the consulate of user's country. 6. Support Bluetooth, wireless reception, automatic translation. 7. Remote security protection, local national emergencies contact. 8. Automatic online services for cross-border shopping, shipping, and tax refunds. 9. The local country has built multiple dedicated cloud database and high-speed TI-level fixed-line telephony, so that the translation speed of the Wi-Fi hotspot translation mobile phone and the original smart phone and the calculation and response speed of other APPS become faster. 10. Add a smart watch for accompanying children and the elderly, as an accessory and independently wirelessly connect to the Wi-Fi hotspot translation mobile phone, and having part of the functions of the mobile phone.

Figure 6A:
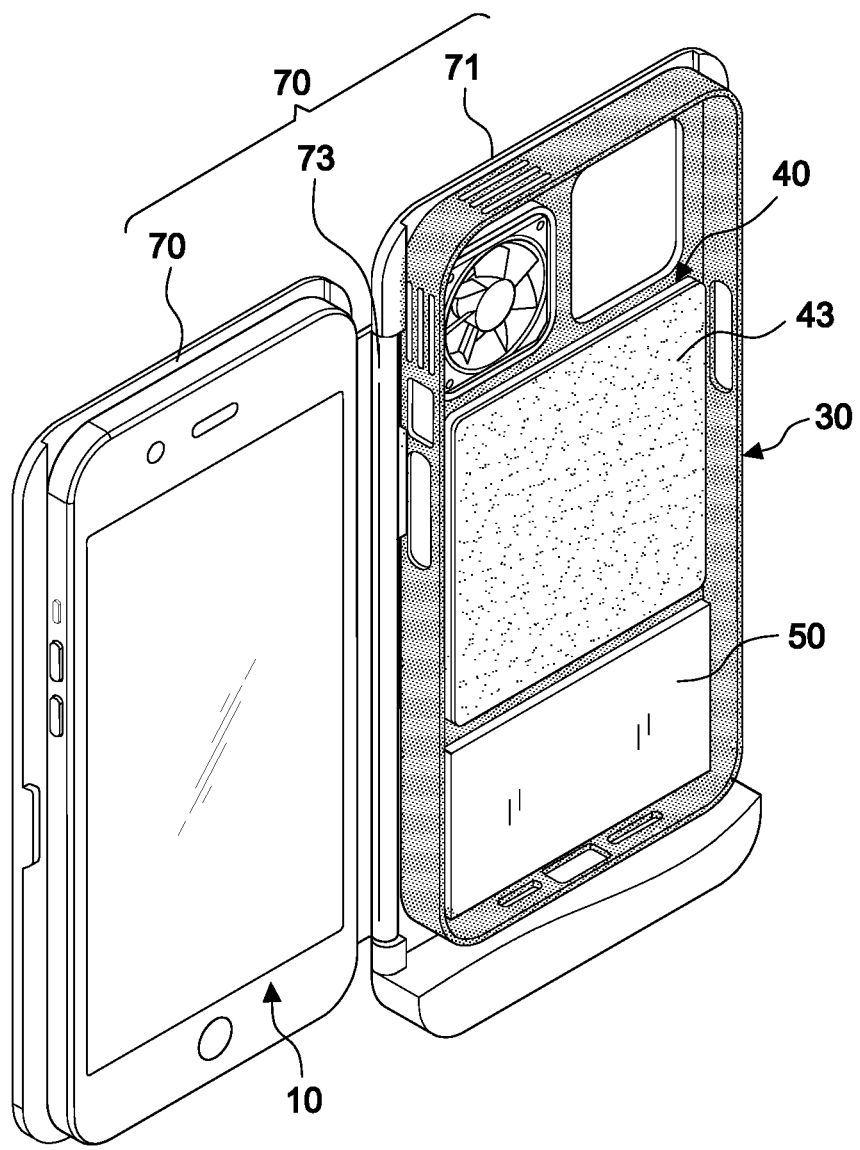
FIG. 6A is an unfolded perspective view of a second embodiment of the present invention.
Figure 6B:
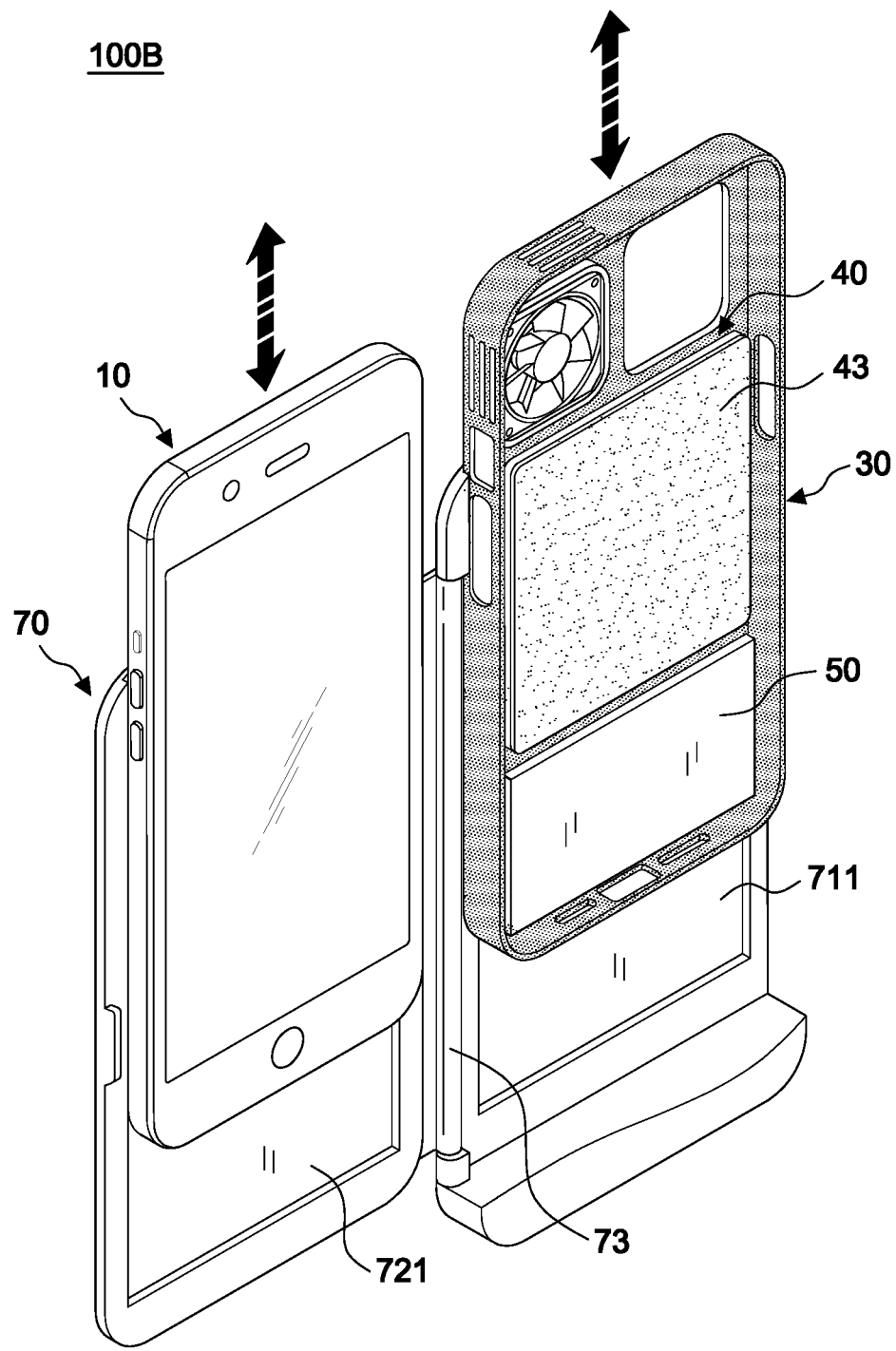
FIG. 6B is a schematic diagram illustrating the use state of a second embodiment of the present invention.
Figure 7:
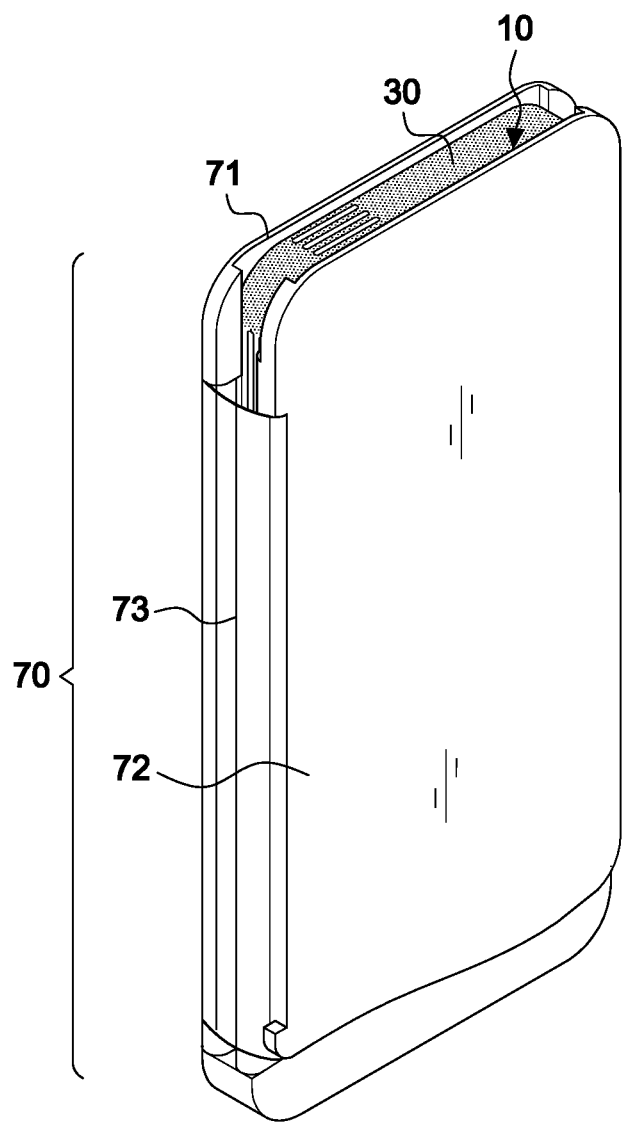
FIG. 7 is a folded perspective view of a second embodiment of the present invention.

With the features disclosed above, the second embodiment of the present invention, as shown in FIGS. 6A~7, has the same structure as the above embodiment, and is denoted by the same reference numerals. The differences are: the Wi-Fi hotspot and translation device 30 is arranged on a foldable body 70, the foldable body 70 includes a base 71, a cover 72 and a pivoting part 73, wherein the base 71 is used to accommodate the Wi-Fi hotspot and translation device 30, the cover 72 is used to accommodate the smart phone 10, by the characteristic of the pivoting part 73 being in a folded state or an unfolded state, so as to form foldable type dual display translation smart phone 100B. In this embodiment, the base 71 and the inner side of the cover 72 are respectively provided with multiple sliding grooves 711, 721, for allowing the Wi-Fi hotspot and translation device 30 and the smart phone 10 slide up and down or taken out.

Figure 8:
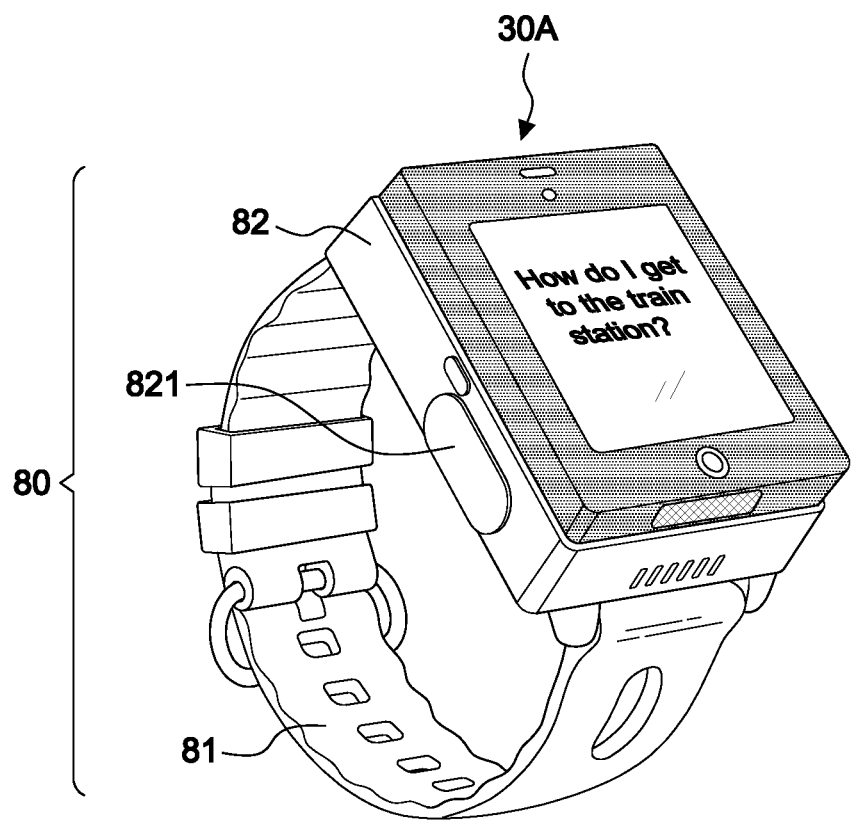
FIG. 8 is a schematic diagram illustrating the use state of a third embodiment of the present invention.
Figure 9:
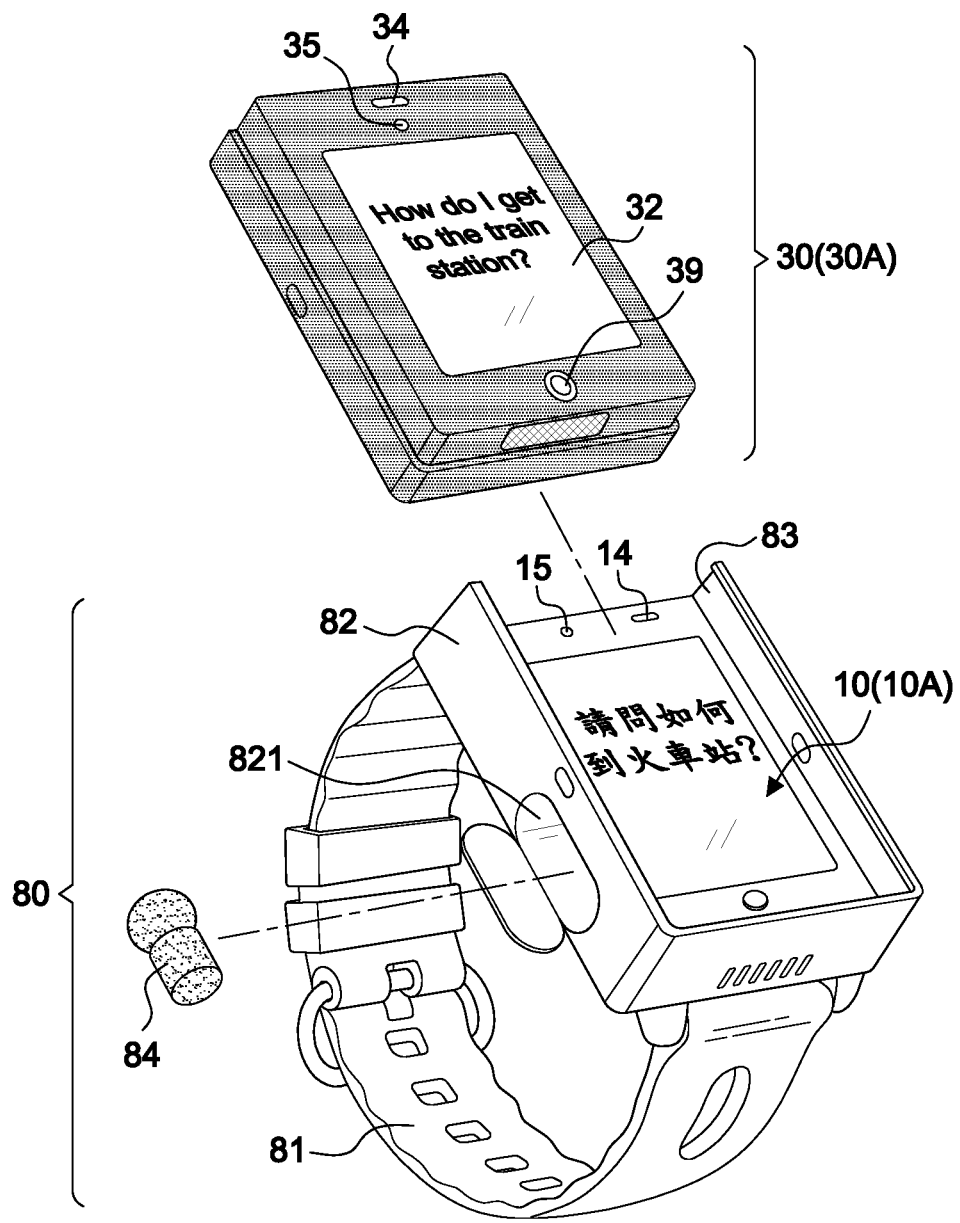
FIG. 9 is an exploded perspective view of the use state of the third embodiment of the present invention.

With the features disclosed above, the third embodiment of the present invention, as shown in FIGS. 8~9, has the same structure as the above embodiment, and is denoted by the same reference numerals. The differences are: the Wi-Fi hotspot and translation device 30 and the smart phone 10 are set on a watch body 80, the watch body 80 includes a watch strap 81, and a seat body 82 set on the watch strap 81, and the smart phone 10 is in the form of a smaller body and set in the seat body 82, and the seat body 82 is provided with a combination groove 83 on the top of the smart phone 10; the Wi-Fi hotspot and translation device 30 is set to be installed in the combination groove 83 to form a watch type dual display translation smart phone 100C; in this embodiment, the lateral side of the seat body 82 has an accommodation room 821 for accommodating a Bluetooth earphone 84. Therefore, as shown in FIG. 8, the Wi-Fi hotspot and translation device 30(30A) is set to be installed in the combination groove 83 in normal state, and is combined with the seat body 82 into one body, just like a watch, as shown in FIG. 9, the Wi-Fi hotspot and translation device 30 can be separated from the combining groove 83.

With the features disclosed above, the present invention combines the original functional with the Wi-Fi hotspot and translation device 30, using first and second oscillating heat dissipation modules 60A, 60B to improve heat dissipation performance, then using the phase change temperature regulation micro airbag 42 to achieve the effect of intelligent temperature adjustment, and becomes the Wi-Fi hotspot and translation device 30, and then ingeniously combined with the smart phone 10, using the artificial intelligence chip 36, parallel computing processing, so that the working efficiency of the Wi-Fi hotspot and translation device 30 is greatly improved, so that it can be used in parallel with the smart phone in various types, and then integrate the functions of the Wi-Fi hotspot and translation device and smart phone into a mobile phone for translation with Wi-Fi when going abroad, and at the same time has many convenient functions.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A Wi-Fi hotspot translation mobile phone, comprising:
a smart phone having a front side, a rear side, and a body periphery located between the front side and the rear side, and inside the smart phone having a first processing unit, a first display unit, a camera, a first speaker unit, a first microphone unit, a memory, a first wireless transmission unit, a first interface, a first battery, and a first charging port;
a Wi-Fi hotspot and translation device including a casing, the casing has an inner edge surface, an outer edge surface, and a peripheral edge between the inner edge surface and the outer edge surface, a control circuit board, and a plurality of electronic components or heating components provided on the control circuit board, and a second battery;
wherein the Wi-Fi hotspot and translation device can be combined with the smart phone, the casing including:
a first nano crystal heat dissipation coating, which consists of: a mixture of nano natural crystal powder, quartz powder, graphite powder, silicon oxide, and UV photosensitive hardener, and coated on the inner surface of the casing;
a first thin oscillating plate, which is a passive element composed of a tiny ultrasonic oscillator, a quartz oscillator, and a piezoelectric ceramic plate, since the second battery supplies power to it, it can generate a micro-vibration above 30 MHZ when energized, it is installed in the casing and close to the first nano crystal heat dissipation coating to form a first oscillation heat dissipation module, which uses the ion wind or ultrasonic waves released by the first thin oscillating plate to generate resonance to improve the air convection effect of the first nano crystal heat dissipation coating, so as to improve the heat dissipation efficiency of the oscillating heat dissipation module;
a phase change temperature regulating micro airbag, with a phase change material as a core, a polymer material as a core shell, and the phase change material is covered inside the micron or nanoparticle, forming a phase change temperature regulating micro airbag with a core shell structure, and injection molding the phase change temperature regulating micro airbag on the CPU, GPU or high-power chip of the circuit board, or filling it in the casing, using the change of the solid-liquid phase state of phase change material, so that the phase change material absorbs or releases a large amount of latent heat, so as to keep the temperature of the micro airbag constant;
a heat dissipation plate is arranged in the casing and relative to the position of the circuit board, its surface is coated with a second nano crystal heat dissipation coating, and the inner surface is provided with a second thin oscillating plate relative to the position of the phase change temperature regulation micro airbag to form a second oscillating heat dissipation module;
a thin fan is arranged in the casing, and the casing is provided with an air inlet and an air outlet relative to the position of the thin fan; and
on the circuit board including:
a). a second processing unit;
b). a second display unit is electrically connected to the second processing unit, and exposed at the outer periphery of the casing;
c). a Wi-Fi module is electrically connected to the second processing unit, for receiving wireless communication signal in the local country;
d). a second speaker unit is electrically connected to the second processing unit, and exposed at the outer periphery of the casing;
e). a second microphone unit is electrically connected to the second processing unit, and exposed at the outer periphery of the casing;
f). a second wireless transmission unit is electrically connected to the second processing unit, the Wi-Fi hotspot and translation device forms a mutual correspondence wireless transmission mode with the first wireless transmission unit of the smart phone through the second wireless transmission unit;
g). a second interface is electrically connected to the second processing unit, and exposed at the outer periphery of the casing for providing user to operate;
h). an artificial intelligence chip is electrically connected to the second processing unit, and has an AI program built in it;
i). a mobile payment module is electrically connected to the second processing unit; and
the second battery is arranged in the casing and is electrically connected to the second processing unit to supply power required by the electronic components in the casing; a second charging port is electrically connected to the second battery, and connects the external power supply with a second charging wire;
whereby combining the Wi-Fi hotspot and translation device and the smart phone allow the smart phone to receive wireless communication signal, make the smart phone connect with a translation software on the cloud through the first wireless transmission unit, and then through the first wireless transmission unit and the second wireless transmission unit of the Wi-Fi hotspot and translation device, the wireless transmission is synchronized with each other, so as to form a type of a dual display translation mobile phone that can be used separately.

2. The Wi-Fi hotspot translation mobile phone as claimed in claim 1, wherein the thin fan is electrically connected to the second processing unit.

3. The Wi-Fi hotspot translation mobile phone as claimed in claim 1, wherein the Wi-Fi hotspot and translation device includes a wireless charging device for providing wireless charging to the smart phone.

4. The Wi-Fi hotspot translation mobile phone as claimed in claim 1, wherein the periphery of the frame of the Wi-Fi hotspot and translation device is set to be compatible with the body periphery of the smart phone, and a buckle unit is provided on both sides of the frame to allow the smart phone to be installed in the Wi-Fi hotspot and translation device, so as to form a back clip type dual display translation smart phone.

5. The Wi-Fi hotspot translation mobile phone as claimed in claim 1, wherein the Wi-Fi hotspot and translation device is arranged on a foldable body, the foldable body includes a base, a cover and a pivoting part, wherein the base is used to accommodate the Wi-Fi hotspot and translation device, the cover is used to accommodate the smart phone, by the characteristic of the pivoting part being in a folded state or an unfolded state, so as to form foldable type dual display translation smart phone.

6. The Wi-Fi hotspot translation mobile phone as claimed in claim 5, wherein the base and the inner side of the cover are respectively provided with multiple sliding grooves, for allowing the Wi-Fi hotspot and translation device slide up and down or taken out.

7. The Wi-Fi hotspot translation mobile phone as claimed in claim 1, wherein the Wi-Fi hotspot and translation device and the smart phone are set on a watch body, the watch body includes a watch strap, and a seat body set on the watch strap, and the smart phone is in the form of a smaller body and set in the seat body, and the seat body is provided with a combination groove on the top of the smart phone; the Wi-Fi hotspot and translation device is set to be installed in the combination groove in normal state, and is combined with the seat body into one body, which can be separated from the combining groove when required, so as to form a watch type dual display translation smart phone.

8. The Wi-Fi hotspot translation mobile phone as claimed in claim 7, wherein the lateral side of the seat body has an accommodation room for accommodating a Bluetooth earphone.

* * * * *